United States Patent [19]

Park et al.

[11] Patent Number: 5,762,747

[45] Date of Patent: Jun. 9, 1998

[54] INTERFACE APPARATUS FOR A STEPPER

[75] Inventors: Soon-Jung Park; Chung-Jae Lee; Jong-Sun Yun; Young-Ho Park, all of Yongin-gun, Rep. of Korea

[73] Assignee: Samsung Electronics Co., Ltd., Suwon, Rep. of Korea

[21] Appl. No.: 732,985

[22] Filed: Oct. 16, 1996

[51] Int. Cl.$^6$ ............................................. H01L 21/00
[52] U.S. Cl. ............................ 156/345; 438/5; 438/10
[58] Field of Search .......................... 438/5, 10, 17; 156/345 LC, 345 MT

[56] References Cited

U.S. PATENT DOCUMENTS 4,700,311  10/1987  Tributsch et al. .................. 438/10 X
4,767,496   8/1988  Hieber .................................... 438/17

*Primary Examiner*—William Powell
*Attorney, Agent, or Firm*—Jones & Volentine, L.L.P.

[57] ABSTRACT

An interface apparatus located between a chamber unit and a stepper main controller, which collectively constitute a stepper adapted to form a pattern film on a semiconductor substrate by using a photolithography process well-known in the art. The interface is adapted to detect and control abnormal operational states within the chamber unit via a main controller on the main stepper unit even if the main stepper unit and the chamber unit are made by different manufacturers.

9 Claims, 2 Drawing Sheets

INTERFACE APPARATUS FOR A STEPPER

BACKGROUND OF THE INVENTION

1. Field of the Invention

The present invention generally relates to a stepper which is used to fabricate a semiconductor device. More particularly, the invention relates to an interface apparatus located between a chamber and a main controller which constitutes a stepper adapted to form a pattern film on a semiconductor substrate by using a photolithography process well-known in the art.

2. Description of the Prior Art

In general, a stepper system has a chamber which requires an inner temperature thereof to be constantly maintained. If a maloperation occurs in this chamber, the inner temperature of the chamber can change to be more than or less than the required temperature range. Such can result in the occurrence of focus defects on the semiconductor wafers that are fabricated.

As is well-known in the art, a stepper system is obtained from one manufacturer and combined with a stepper main unit which is made by a different manufacturer. Because the chamber unit and the stepper main unit are fabricated by different manufacturers, an interface between the units is limited. The interface only provides an alarm when an abnormal state such as a power failure, a variation in temperature, a maloperation of the chamber unit, or the like, is detected. However, such a conventional interface is not adapted to exert any control over the operation of the chamber unit when such abnormal states occur.

In the conventional interface apparatus for a stepper system, there is a problem in that the operation of a chamber unit does not have a means for being controlled by a main controller in the stepper system when an abnormal state occurs in the chamber unit. As a result, if an abnormal state occurs in the chamber unit of the stepper system the chamber unit continues to operate even while producing an alarm to indicate the presence of the abnormal state within the chamber unit. Accordingly, such abnormal states cause focus defects to occur on semiconductor substrates being processed in the chamber unit. Thus, such abnormal states can result in the fabrication of poor semiconductor devices, if the above described stepper system is used to form patterned films on the substrates.

Particularly, if a power cutting fuse for a chamber unit is electrically cut off, or a voltage source supplying power to the chamber unit is interrupted due to a poor power supply switch, even the alarm to indicate the presence of the abnormal state within the chamber unit fails to operate.

SUMMARY OF THE INVENTION

To solve one or more of the above mentioned problems, it is an object of the invention to provide an interface apparatus for a stepper which is provided with a means for detecting an abnormal operational state within a chamber in the stepper and to control the operation of the chamber unit by means of a main controller located on the main stepper unit.

It is the other object of the present invention to provide an interface apparatus for a stepper adapted to control the operation of a chamber unit in the stepper by means of a main controller thereof if the power supply to the chamber unit is interrupted.

According to an aspect of the present invention, the interface apparatus is provided for a stepper having a chamber unit and a stepper main unit collectively adapted to form a patterned film on a semiconductor substrate, the stepper main unit having a control logic circuit for controlling the chamber unit when an abnormal operational state within the chamber unit is detected, the apparatus comprising a power supply connected between a first source terminal and a second source terminal of the chamber unit, as a means for supplying a constant voltage supply to the interface apparatus; a state detector adapted to be responsive to signals of an abnormal operational state from a first signal terminal and a second signal terminal of the chamber unit, which are adapted for detecting a state in the chamber unit of ceased operations within and of a temperature state which exceeds the temperature limits, and to generate an abnormal state detection signal, the signal from the first signal terminal being adapted to indicate a state of ceased operations and the signal from the second signal terminal being adapted to indicate a state of excess temperature; and having a switching circuit adapted to respond to the receipt of an detection signal indicating an abnormal state of operations, the switching circuit having a means for driving at least one abnormal state indicator lamp, and adapted to provide an abnormal state detection signal to a main controller of the stepper main unit, whereby the chamber can be controlled by the main controller upon the detection of an abnormal state of operations within the chamber.

In the apparatus, the power supply comprises a means for transforming a voltage applied from the first source terminal into a constant voltage supply for the interface apparatus. Also, the power supply further comprises an LED diode which is connected between the first and said second source terminals as a means for indicating that a power source is in the state of supplying power.

In the apparatus, the constant voltage is a bipolar level voltage and the second terminal is a ground.

In the apparatus, the abnormal state detector comprises a first photocoupler for detecting a signal indicative of a state of ceased operations within the chamber unit in response to a signal communicated by the first signal terminal, a second photocoupler for detecting a signal indicative of a temperature state which has exceeded the limits in response to a signal communicated by the second signal terminal, and a logic circuit for performing a logic function to interpret the two signals from the first and second photocouplers and to generate an abnormal state detection signal upon such detection.

In the apparatus, the logic circuit includes a first gate for inversely outputting an output signal from the second photocoupler, and a second gate for receiving output signals from the first photocoupler and the first gate and then outputting at least one of the input signals as an abnormal state detection signal. The first gate comprises an NAND gate having two input terminals which are connected to each other.

In the apparatus, the switching circuit comprises a relay which is switched in response to a level of the abnormal state detection signal.

BRIEF DESCRIPTION OF THE ATTACHED DRAWINGS

FIG. 1 is a schematic block diagram showing a stepper system in which an interface apparatus of the present invention is embodied between a stepper main unit and a chamber unit; and FIG. 2 is a detailed circuit diagram showing the interface apparatus of FIG. 1.

DETAILED DESCRIPTION OF PREFERRED EMBODIMENTS

This invention may be better understood and its objects become apparent to those skilled in the art by the detailed description below with reference to the accompanying drawings.

Figure 1:
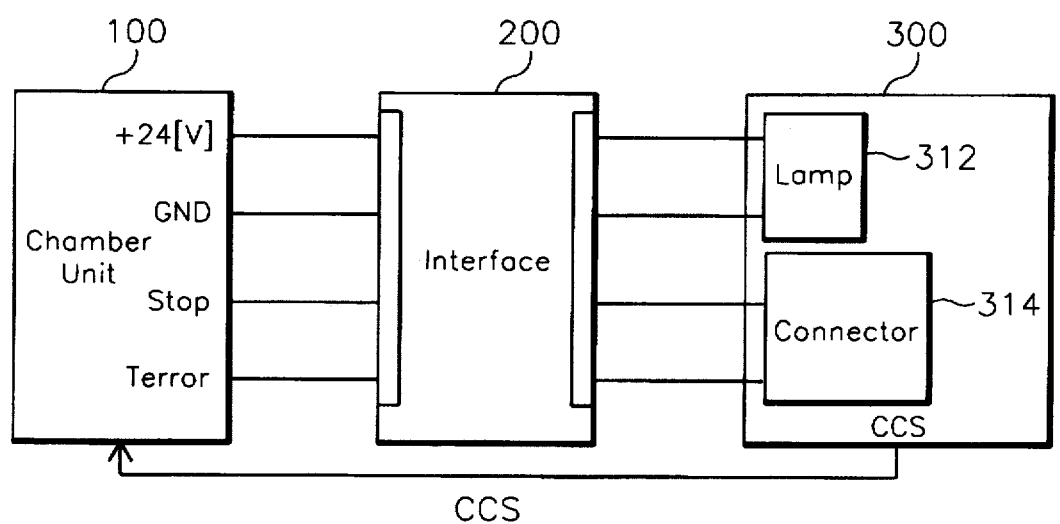
Figure 2:
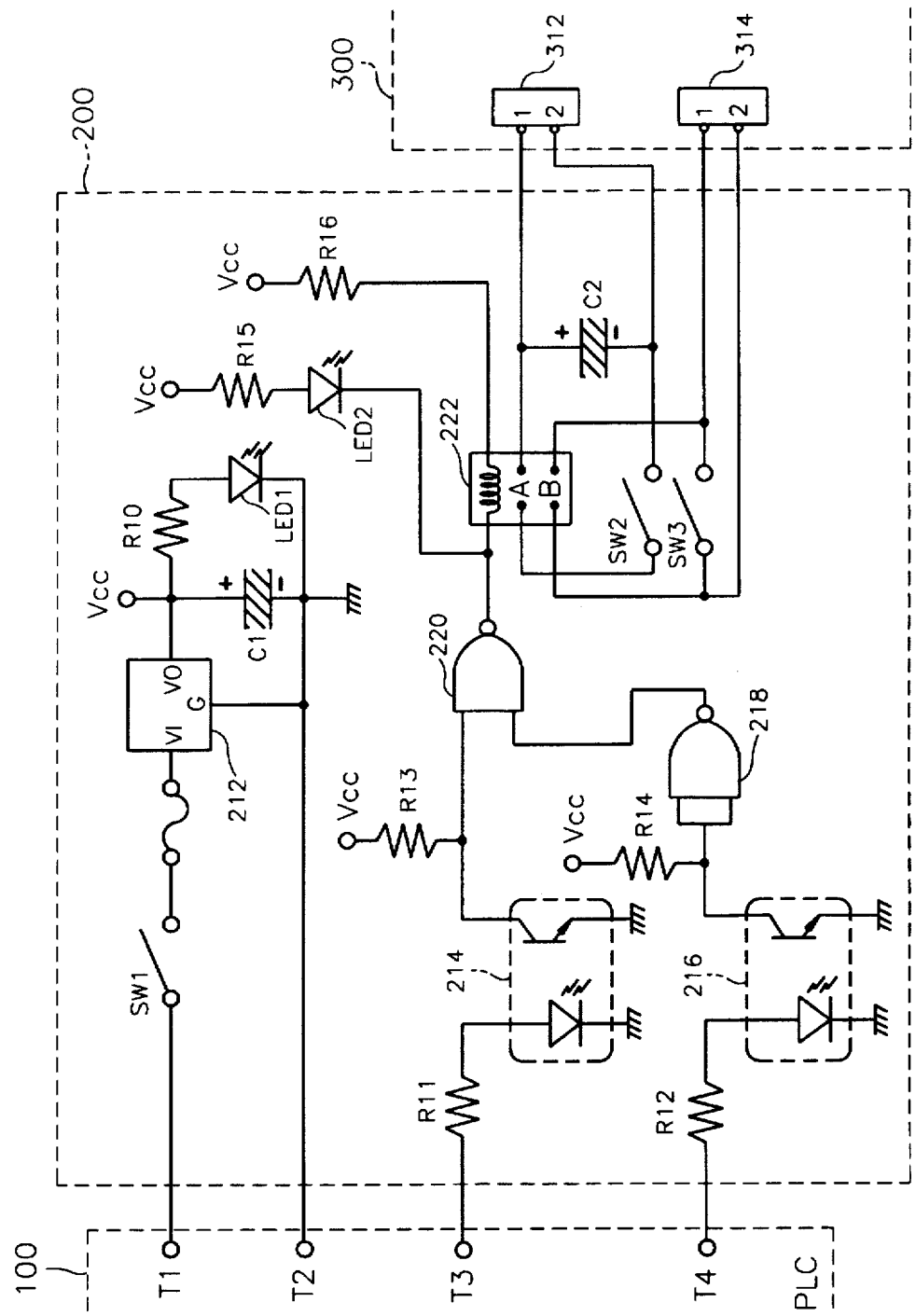

Referring to FIGS. 1 and 2, a novel interface apparatus 200 in accordance with the present invention is located between a PLC (programmable logic controller) 100 in a chamber unit and a stepper main unit 300, which is adapted to detect an abnormal state indicating signal from the PLC 100 and to provide an abnormal state detection signal to the stepper main unit 300. In such a manner, a control signal is provided from the stepper main unit 300 to the chamber unit to stop the operation of the chamber unit. The stepper main unit 300 has a logic circuit for performing the overall functions of the stepper and for controlling the chamber unit.

Referring again to FIG. 2, the interface apparatus 200 of the invention receives signals from output terminals T1 through T4 of the PLC 100. The output terminal T1 is a power source terminal having 24 volts of power applied from the PLC 100, T2 is a grounded terminal, T3 is a signal terminal for outputting a signal to indicate a state of ceased operations within the chamber unit, and T4 is a signal terminal for outputting a signal to indicate a temperature state within the chamber in excess of the temperature limit for the chamber unit. When the chamber unit is in a state of ceased operations, an operation stop state indicating signal of high level is generated through T3. When the temperature within the chamber unit exceeds the temperature limit for the chamber unit, the excess temperature state indicating signal of low level is generated through T4.

Between T1 and T2, a regulator 212 is provided to generate a constant voltage. The regulator 212 is connected in parallel with a condenser C1 at the output terminal V0 thereof. Also, between T1 and the input terminal V1 of the regulator 212, a power switch SW1 and a fuse are connected in series. The power switch SW1 is provided to control the operation of the interface circuit 200. Between both terminals of the condenser C1, a resistor R10 and a red light emitting diode LED1 are connected in series. Thus, the regulator 212 receives a source voltage of 24 V from the power source T1 and generates a constant voltage as a bipolar level constant, when the power switch SW1 is turned on.

In addition, the chamber ceased operations state indicating signal from T3 is applied through a resistor R11 to a photocoupler 214 and the excess temperature state indicating signal from T4 is applied through a resistor R12 to a photocoupler 216. The photocouplers 214 and 216 are provided to detect the state of ceased operations signal and the excess temperature state indicating signal, respectively. If the ceased operations state indicating signal is detected by the photocoupler 214, it is applied to one input terminal of NAND gate 220. Also, if the excess temperature state indicating signal is detected by the photocoupler 216, it is applied through a NAND gate 218 to the other input terminal of the NAND gate 220. The NAND gate 218 serves as an inverting gate because two input terminals thereof are connected to each other.

Also, a relay 222 is connected between the output terminal of the NAND gate 220 and a power source Vcc, and a green light emitting diode LED2 is connected there between. Between the power source Vcc and the relay 222 and between the power source Vcc and the diode LED2, resistors R16 and R15 are connected, respectively. The relay 222 constitutes a switching circuit which is provided to drive an abnormal state indicating lamp or LED in response to the receipt of an abnormal state detection signal from one or more of the photocouplers 214 and 216. The abnormal state detection signals are applied to a main controller in the stepper main unit 300 to provide a control for the operation of the chamber unit by means of the mail controller.

In detail, in accordance with the switching operation of the relay 222, the abnormal state detection signal, i.e. an error operation signal of the chamber unit, is applied through the relay switch SW2 or SW3 to the stepper main unit 300. Then, a lamp 312 in the stepper main unit 300 turns on or off, and at the same time as the abnormal state detection signal is applied through an error transmitting connector 314 to a main controller of the stepper main unit. Thus, the main controller therein outputs a control signal which is applied to the chamber unit to interrupt the operation of the chamber unit in response to receipt of the abnormal state detection signal.

The operation of the interface apparatus having the above mentioned construction will be described hereinafter with reference to FIG. 2.

In FIG. 2, if the operation of the chamber unit stops, the PLC 100 in the chamber unit outputs a chamber operations ceased state indicating signal of high level through the output terminal T3. The photocoupler 214 is activated by the signal having a high level to output an abnormal state detection signal of a low level through the output terminal thereof. As a result, the NAND gate 220 outputs the abnormal state detection signal at a high level to enable the relay 222 to be switched off.

Depending on the switching off of the relay 222, the contact terminals A of the relay 222 are electrically connected. Then, the abnormal state detection signal of high level from the NAND gate 220, i.e. an error operation signal of the chamber unit, is supplied through the connector 314 to the main controller of the stepper main unit 300. Accordingly, the main controller thereof outputs a control signal to interrupt the operation of the chamber unit. At the same time, the contact terminals B of the relay are electrically disconnected from each other and therefore the lamp 312 and the diode LED2 are turned off to collectively indicate a normal operational state for the chamber unit.

On the other hand, if a limit temperature of the chamber unit changes during the normal operation thereof, that is, when the temperature in the chamber exceeds the temperature limit, the PLC 100 of the chamber unit outputs an excess temperature state indicating signal of a low level through the output terminal T4 thereof. The photocoupler 216 is inactivated by the low level signal and outputs an abnormal state detection signal of a high level through the output terminal thereof. As a result, the NAND gate 218 outputs the abnormal state detection signal of low level to the NAND gate 220 to enable the relay 222 to be switched off.

Depending on the switching off of the relay 222, the contact terminals A of the relay 222 are electrically corrected. Then, the abnormal state detection signal of a high level from the NAND gate 220, i.e. an error operation signal of the chamber unit, is supplied through the connector 314 to the main controller of the stepper main unit 300. Accordingly, the main controller thereof outputs a control signal to interrupt the operation of the chamber unit. At the same time, the contact terminals B of the relay are electrically disconnected from each other. As a result the lamp 312 and the diode LED2 are turned off to collectively indicate a normal operational state for the chamber unit.

The operation of the interface apparatus in the event that the power supply to the chamber unit is interrupted due to a power failure or from a fuse having burned out will be described below.

During the normal operation of the chamber unit, the relay 222 is always switched on. However, when a power failure occurs, the relay 222 is switched off because a source voltage is not applied to the interface circuit 200. As a result, the interface apparatus executes the same control operation as that of the chamber unit on the basis of the detection of the above described abnormal state indicating signal, so that the abnormal state detection signal, i.e. an error operation signal of the chamber unit, is supplied for the main controller of the stepper main unit 300. Therefore, the main controller thereof outputs a control signal to interrupt the operation of the chamber unit. At the same time, the contact terminals B of the relay are electrically disconnected from each other. Thus, the lamp 312 and the diode LED2 are turned off to collectively indicate a normal operational state for the chamber unit. If the lamp 312 and the diode LED2 continue to be turned off, then the chamber unit is being operated normally.

As described above, even though a stepper system embodying an interface apparatus according to the present invention is combined with a chamber unit and a stepper main unit which are fabricated by different manufacturers, the interface apparatus can detect abnormal conditions of the chamber unit and stop the operation thereof. Therefore, damage to the semiconductor substrates in the chamber unit from the occurrence of focus defects can be prevented.

Furthermore, because the interface apparatus includes photocouplers for detecting abnormal state indicating signals from the chamber unit, the chamber unit and the stepper main unit are electrically isolated from each other.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the invention pertains.

What is claimed is:

1. An interface apparatus for a stepper having a chamber unit and a stepper main unit adapted to form a patterned film on a semiconductor substrate, said stepper main unit having control logic for controlling said chamber unit upon detecting an abnormal state of said chamber unit, said apparatus comprising:

a power supply connected between a first source terminal and a second source terminal of said chamber unit, as a means for supplying a constant voltage for said interface apparatus;

an abnormal state detector responsive to signals from a first signal terminal and a second signal terminal of said chamber unit, said detector being adapted for detecting in said chamber unit a state of ceased operations or a temperature state in excess of a temperature limit for said chamber unit, and having a means to generate an abnormal state detection signal, the signal from said first signal terminal being adapted to indicate a state of ceased operations and the signal from said second signal terminal being adapted to indicate an excess temperature state; and a switching circuit adapted to respond to the abnormal state detection signal, by driving an abnormal state indicating lamp, and by providing an abnormal state detection signal to a main controller of said stepper main unit, whereby said chamber can be controlled by said main controller when an abnormal operational state within said chamber is detected.

2. The interface apparatus according to claim 1, wherein said power supply comprises a means for transforming a voltage applied from said first source terminal into a constant voltage for said interface apparatus.

3. The interface apparatus according to claim 2, wherein said constant voltage is a bipolar level voltage.

4. The interface apparatus according to claim 2, wherein said power supply further comprises an LED diode which is connected between said first source terminal and said second source terminal, which is adapted to show a power source supplying state.

5. The interface apparatus according to claim 1, wherein said second terminal is a ground.

6. The interface apparatus according to claim 1, wherein said abnormal state detector comprises a first photocoupler for detecting a signal which indicates a state of ceased operations within said chamber unit in response to a signal applied from said first signal terminal, a second photocoupler for detecting a signal which indicates an excess temperature state in response to the signal applied from said second signal terminal, and a logic circuit for performing a logic function upon the two signals from said first and said second photocouplers and to thereby generate an abnormal state detection signal.

7. The interface apparatus according to claim 6, wherein said logic circuit includes a first gate for inversely outputting the output signal of said second photocoupler, and a second gate for receiving the output signals of said first photocoupler and said first gate and then outputting at least one signal of two said input signals as the abnormal state detection signal.

8. The interface apparatus according to claim 7, wherein said first gate comprises an NAND gate having two input terminals which are connected to each other.

9. The interface apparatus according to claim 1, wherein said switching circuit comprises a relay which is switched in response to a level of said abnormal state detection signal.

* * * * *